(12) United States Patent
Chang et al.

(10) Patent No.: US 11,315,951 B2
(45) Date of Patent: Apr. 26, 2022

(54) SEMICONDUCTOR DEVICE AND METHOD OF FABRICATING THE SAME

(71) Applicant: ELECTRONICS AND TELECOMMUNICATIONS RESEARCH INSTITUTE, Daejeon (KR)

(72) Inventors: Sung-Jae Chang, Daejeon (KR); Dong Min Kang, Daejeon (KR); Sung-Bum Bae, Daejeon (KR); Hyung Sup Yoon, Daejeon (KR); Kyu Jun Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 17/094,931

(22) Filed: Nov. 11, 2020

(65) Prior Publication Data

US 2021/0143182 A1 May 13, 2021

(30) Foreign Application Priority Data

Nov. 11, 2019 (KR) .......................... 10-2019-0143763
Mar. 11, 2020 (KR) .......................... 10-2020-0030007

(51) Int. Cl.
*H01L 27/12* (2006.01)
*H01L 21/84* (2006.01)
(Continued)

(52) U.S. Cl.
CPC .......... *H01L 27/12* (2013.01); *H01L 21/6835* (2013.01); *H01L 21/84* (2013.01);
(Continued)

(58) Field of Classification Search
CPC ..... H01L 27/12; H01L 21/84; H01L 21/6835; H01L 23/3171; H01L 2221/68318;
(Continued)

(56) References Cited

U.S. PATENT DOCUMENTS 8,193,538 B2 * 6/2012 Wort ..................... H01J 37/321
257/77
8,558,295 B2 * 10/2013 Yoon ....................... G11C 11/22
257/295

(Continued)

FOREIGN PATENT DOCUMENTS

| KR | 101762907 B1 | 7/2017 |
| KR | 101955195 B1 | 3/2019 |
| KR | 102060966 B1 | 12/2019 |

*Primary Examiner* — Vu A Vu
(74) *Attorney, Agent, or Firm* — Rabin & Berdo, P.C.

(57) ABSTRACT

Provided are a semiconductor device and a method of fabricating the same. The semiconductor device includes a substrate having a first region and a second region, a buffer layer disposed on the substrate, a semiconductor layer disposed on the buffer layer, a barrier layer disposed on the semiconductor layer, a first source electrode, a first drain electrode, and a first gate electrode disposed therebetween, which are disposed on the barrier layer in the first region, a second source electrode, a second drain electrode, and a second gate electrode disposed therebetween, which are disposed on the barrier layer in the second region, and a ferroelectric pattern interposed between the first gate electrode and the barrier layer.

18 Claims, 16 Drawing Sheets

(51) Int. Cl.
*H01L 21/683* (2006.01)
*H01L 23/31* (2006.01)

(52) U.S. Cl.
CPC .. *H01L 23/3171* (2013.01); *H01L 2221/6835* (2013.01); *H01L 2221/68318* (2013.01)

(58) Field of Classification Search
CPC ......... H01L 2221/6835; H01L 27/1218; H01L 2221/68381
USPC ....................................................... 257/295
See application file for complete search history.

(56) References Cited

U.S. PATENT DOCUMENTS

| | | | |
|---|---|---|---|
| 9,087,889 B2 * | 7/2015 | Nakajima | H01L 27/095 |
| 10,276,704 B1 * | 4/2019 | Teo | H01L 29/40111 |
| 2013/0240951 A1 * | 9/2013 | Bedell | H01L 29/66462 |
| | | | 257/194 |
| 2014/0017885 A1 | 1/2014 | Yoon et al. | |
| 2015/0187599 A1 | 7/2015 | Ko et al. | |
| 2018/0175185 A1 * | 6/2018 | Chang | H01L 29/513 |

* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 of Korean Patent Application Nos. 10-2019-0143763, filed on Nov. 11, 2019, and 10-2020-0030007, filed on Mar. 11, 2020, the entire contents of which are hereby incorporated by reference.

BACKGROUND

The present disclosure herein relates to a semiconductor device and a method of fabricating the same.

A high electron mobility transistor (HEMT) uses a 2-dimensional electron gas (2DEG) layer, which is generated by polarization and band discontinuity at an hetero-junction interface of semiconductor materials having different band gaps, as a channel layer (a passage through which an electron moves from a source to a drain) of a semiconductor device. The above-described HEMT is used in a high power-high frequency system due to a high electron mobility at the 2DEG layer.

SUMMARY

The present disclosure provides a flexible semiconductor device that is usable in a high power-high frequency system.

The present disclosure also provides a method of fabricating a semiconductor device, which is capable of reducing defects and saving fabrication costs.

An embodiment of the inventive concept provides a semiconductor device including: a substrate having a first region and a second region; a buffer layer disposed on the substrate; a semiconductor layer disposed on the buffer layer; a barrier layer disposed on the semiconductor layer; a first source electrode, a first drain electrode, and a first gate electrode disposed therebetween, which are disposed on the barrier layer in the first region; a second source electrode, a second drain electrode, and a second gate electrode disposed therebetween, which are disposed on the barrier layer in the second region; and a ferroelectric pattern interposed between the first gate electrode and the barrier layer.

In an embodiment, the substrate may be flexible.

In an embodiment, the semiconductor device may further include an adhesive layer interposed between the substrate and the buffer layer.

In an embodiment, the semiconductor device may further include a hexagonal boron nitride layer interposed between the substrate and the buffer layer.

In an embodiment, each of the first source electrode, the first drain electrode, the second source electrode, and the second drain electrode may penetrate the barrier layer and extend into the semiconductor layer.

In an embodiment, the ferroelectric pattern may be provided in plurality and, a plurality of the ferroelectric patterns may be arranged in one row in a first direction, and the first gate electrode may extend in the first direction to cover side surfaces and top surfaces of the ferroelectric patterns.

In an embodiment, the first gate electrode, the first source electrode, and the first drain electrode may constitute a first transistor, and the second gate electrode, the second source electrode, and the second drain electrode may constitute a second transistor, the first transistor may have a positive threshold voltage, and the second transistor may have a negative threshold voltage.

In an embodiment, the semiconductor device may further include a 2-dimensional electron gas (2DEG) layer disposed in the semiconductor layer.

In an embodiment, the semiconductor device may further include a recessed region defined in an upper portion of each of the semiconductor layer and the barrier layer at one side of the first gate electrode. Here, a sidewall of the ferroelectric pattern may be exposed from an inside wall of the recessed region, and the first gate electrode may cover the inside wall and a bottom surface of the recessed region.

In an embodiment, the semiconductor device may further include a third insulation pattern interposed between the first gate electrode and the semiconductor layer, between the first gate electrode and a sidewall of the barrier layer, and between the first gate electrode and the sidewall of the ferroelectric pattern.

In an embodiment, the semiconductor device may further include: a first insulation pattern interposed between the barrier layer and the ferroelectric pattern; a second insulation pattern interposed between the ferroelectric pattern and the first gate electrode; and a protection layer configured to contact a side surface and a top surface of the first gate electrode, a side surface of the first insulation pattern, a side surface of the ferroelectric pattern, and a side surface of the second insulation pattern.

In an embodiment, the second gate electrode may contact the barrier layer.

In an embodiment of the inventive concept, a method of fabricating a semiconductor device includes: sequentially stacking a separation layer, a buffer layer, a semiconductor layer, and a barrier layer on a first sacrificial substrate having a first region and a second region; forming a first source electrode and a first drain electrode on the barrier layer in the first region and forming a second source electrode and a second drain electrode on the barrier layer in the second region; forming a ferroelectric pattern on the barrier layer between the first source electrode and the first drain electrode; forming a first gate electrode on the ferroelectric pattern and forming a second gate electrode on the barrier layer between the second source electrode and the second drain electrode; and removing the first sacrificial substrate.

In an embodiment, the separation layer may include a hexagonal boron nitride layer.

In an embodiment, the method may further include, before the removing of the first sacrificial substrate, forming a first adhesive layer on the first gate electrode and the second gate electrode; and forming a second sacrificial substrate on the first adhesive layer.

In an embodiment, the method may further include, before the forming of the first adhesive layer, forming a protection layer configured to cover an entire surface of the first sacrificial substrate on which the first gate electrode and the second gate electrode are formed.

In an embodiment, the method may further include, after the removing of the first sacrificial substrate, forming a flexible substrate below the separation layer.

In an embodiment, the method may further include, after the removing of the first sacrificial substrate, forming a second adhesive layer below the separation layer; and bonding a flexible substrate to the second adhesive layer.

In an embodiment, the method may further include, before the forming of the first gate electrode and the second gate electrode, forming a recessed region by etching a portion of each of the semiconductor layer and the barrier layer, which is disposed next to the ferroelectric pattern; and forming a third insulation pattern configured to cover an inside wall and a bottom surface of the recessed region.

In an embodiment, the forming of the first source electrode, the first drain electrode, the second source electrode, and the second drain electrode may include: forming metal patterns, which are spaced apart from each other, on the barrier layer; and diffusing metal in the metal patterns into a portion of each of the barrier layer and the semiconductor layer by performing a heat treatment process.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 5 to 10 and 11A to 13A are cross-sectional views sequentially illustrating processes of fabricating the semiconductor device having a cross-section in FIG. 2 according to the embodiments of the inventive concept; and FIGS. 11B to 13B are cross-sectional views sequentially illustrating processes of fabricating the semiconductor device having a cross-section in FIG. 3 according to the embodiments of the inventive concept.

DETAILED DESCRIPTION

Figure 1:
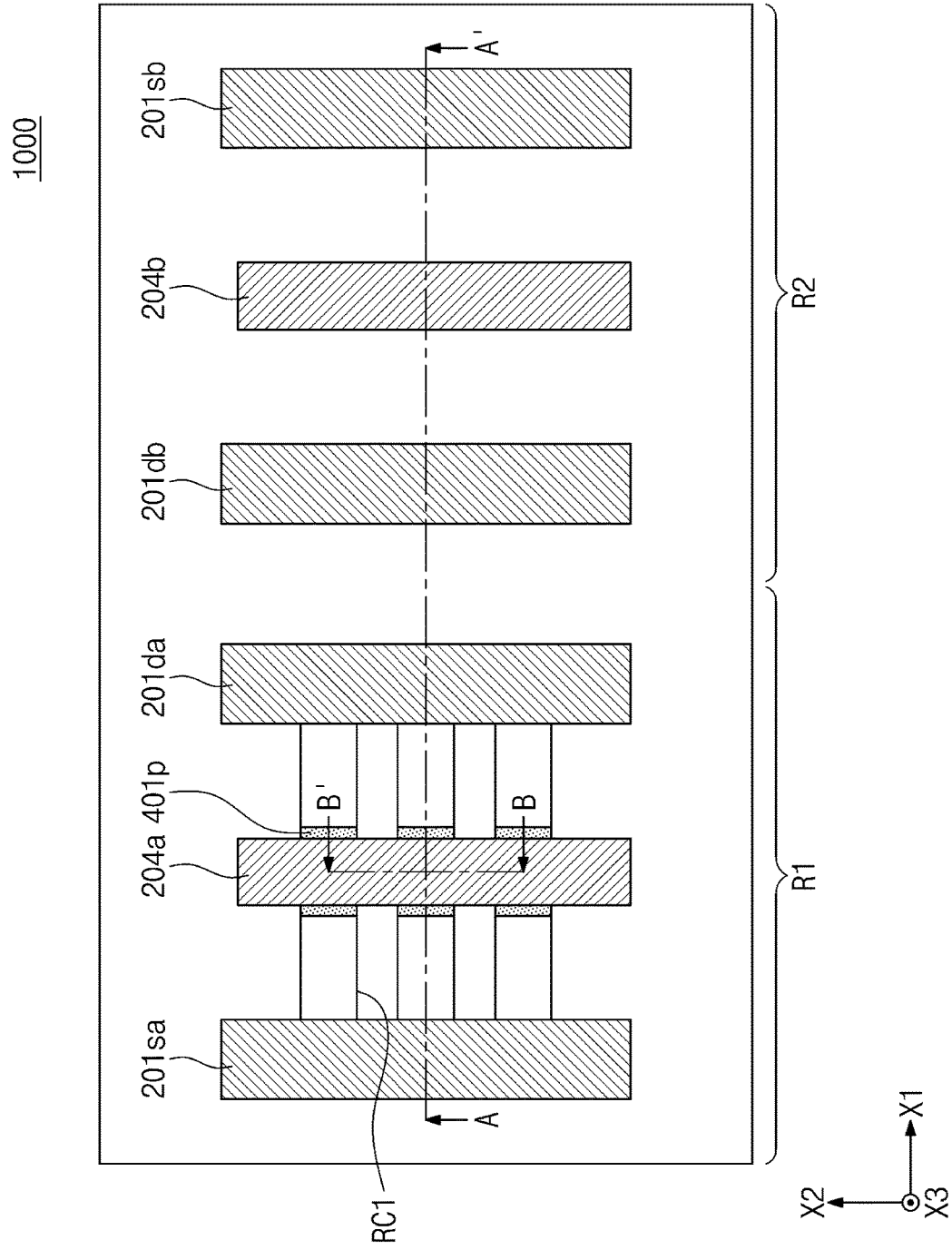
FIG. 1 is a plan view of a semiconductor device according to embodiments of the inventive concept.

The objects, other objectives, features, and advantages of the inventive concept will be understood without difficulties through preferred embodiments below related to the accompanying drawings. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art.

In the specification, it will be understood that when a component is referred to as being 'on' another component, it can be directly on the other component, or an intervening component may also be present. Also, in the figures, the dimensions of components are exaggerated for clarity of illustration.

The embodiment in the detailed description will be described with sectional views and/or plain views as ideal exemplary views of the present invention. Also, in the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region having a right angle illustrated in the drawings may have a round shape or a shape having a predetermined curvature. Areas exemplified in the drawings have general properties, and are used to illustrate a specific shape of a semiconductor package region. Thus, this should not be construed as limited to the scope of the present invention. It will be understood that although the terms first and second are used herein to describe various elements, these elements should not be limited by these terms. These terms are only used to distinguish one component from another component. An embodiment described and exemplified herein includes a complementary embodiment thereof.

In the following description, the technical terms are used only for explaining a specific exemplary embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Hereinafter, exemplary embodiments will be described in detail with reference to the accompanying drawings.

Figure 2:
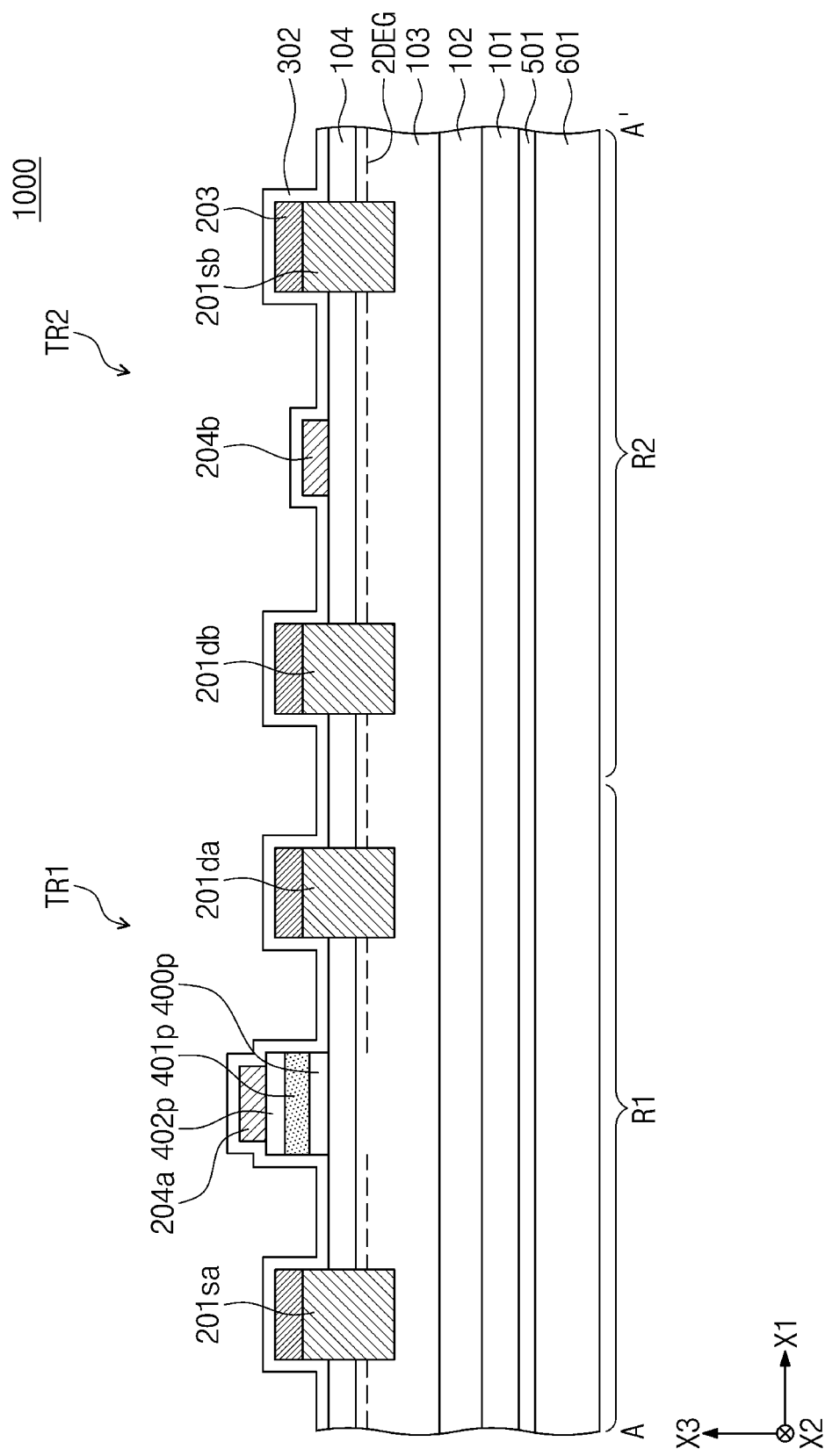
FIG. 2 is a cross-sectional view taken along line A-A' of FIG. 1.
Figure 3:
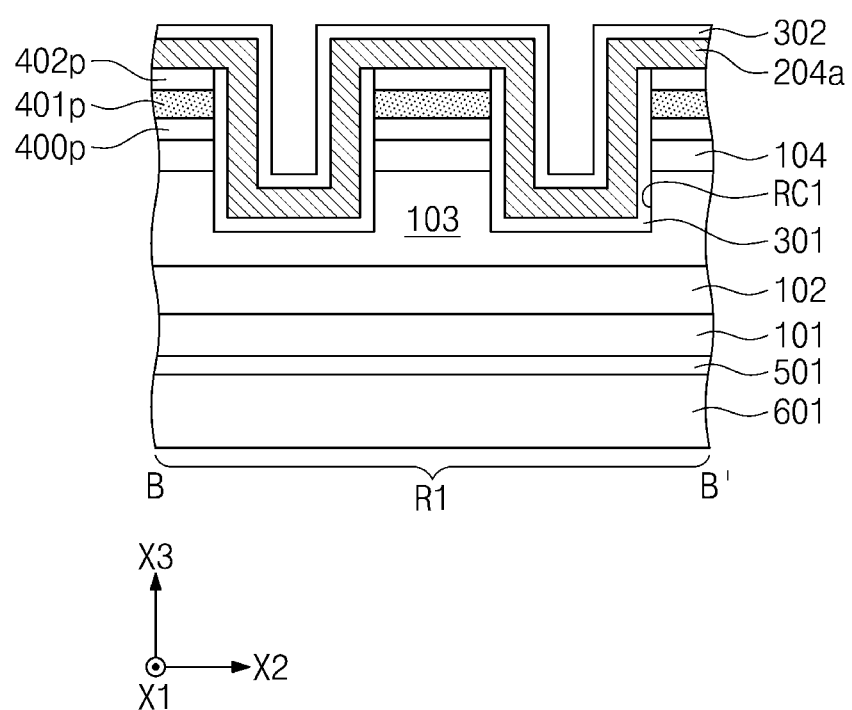
FIG. 3 is a cross-sectional view taken along line B-B' of FIG. 1.

FIG. 1 is a plan view of a semiconductor device according to embodiments of the inventive concept. FIG. 2 is a cross-sectional view taken along line A-A' of FIG. 1. FIG. 3 is a cross-sectional view taken along line B-B' of FIG. 1.

Referring to FIGS. 1 to 3, a semiconductor device 1000 according to an embodiment includes a substrate 601. The substrate 601 may have a first region R1 and a second region R2. The first region R1 may be a transistor region having a positive threshold voltage. The second region R2 may be a transistor region having a negative threshold voltage. On the substrate 601, a substrate adhesive layer 501, a separation layer 101, a buffer layer 102, a semiconductor layer 103, and a barrier layer 104 are sequentially laminated. The substrate 601 may be flexible. Preferably, the substrate 601 may include polyethylene terephthalate (PET) or polyimide. The substrate adhesive layer 501 may include one of benzocyclobutene resin or wax. The separation layer 101 may include a hexagonal boron nitride layer. The semiconductor layer 103 may be a group III-V semiconductor compound. The semiconductor layer 103 may include at least one selected from AlN, InN, GaN, AlGaN, InGaN, AlInN, AlGaInN, and GaAs. The semiconductor layer 103 may be doped with an impurity or may not be doped with an impurity. The buffer layer 102 may have a different lattice constant from that of the semiconductor layer 103. The buffer layer 102 may have an energy band gap wider than that of the semiconductor layer 103. The buffer layer 102 may be, e.g., GaN or AlN.

The barrier layer 104 may have hetero-conjunction with the semiconductor layer 103. The barrier layer 104 may include at least one selected from Al, Ga, In, and B or a nitride thereof. The semiconductor layer 104 may be doped with an impurity or may not be doped with an impurity. The barrier layer 104 may have a different lattice constant from that of the semiconductor layer 103. The barrier layer 104 may have an energy band gap wider than that of the semiconductor layer 103. A 2-dimensional electron gas (2DEG) layer may be provided at a hetero-conjunction interface between the semiconductor layer 103 and the barrier layer 104 by polarization and band discontinuity. The 2DEG layer may be disposed in the semiconductor layer 103. The 2DEG layer may be used as a channel layer through which an electron moves in a HEMT device.

In the first region R1, a first source electrode 201*sa* and a first drain electrode 201*da* may be disposed on the barrier layer 104. In the second region R2, a second source electrode 201sb and a second drain electrode 201db may be disposed on the barrier layer 104. Each of the first source electrode 201sa, the first drain electrode 201da, the second source electrode 201sb, and the second drain electrode 201db may pass through the barrier layer 104 and extend to the inside of the semiconductor layer 103. Each of the first source electrode 201sa, the first drain electrode 201da, the second source electrode 201sb, and the second drain electrode 201db may include at least one metal selected from Ti, Al, Ni, Au, Pd, Cu, Co, and Pt and a coupled material of the semiconductor materials of the barrier layer 104 and the semiconductor layer 103 or an alloy of the metal and the semiconductor material. Each of the first source electrode 201sa, the first drain electrode 201da, the second source electrode 201sb, and the second drain electrode 201db may protrude from the barrier layer 104.

Interconnect patterns 203 may be disposed on the first source electrode 201sa, the first drain electrode 201da, the second source electrode 201sb, and the second drain electrode 201db, respectively. Each of the first source electrode 201sa, the first drain electrode 201da, the second source electrode 201sb, and the second drain electrode 201db may contact the 2DEG layer. The first source electrode 201sa may not be connected to the first drain electrode 201da by the 2DEG layer. However, the second source electrode 201sb may be connected to the second drain electrode 201db by the 2DEG layer.

Although not shown, the first source electrode 201sa may be connected to the second source electrode 201sb by one of the interconnect patterns 203. The first drain electrode 201da may be connected to the second drain electrode 201db by another of the interconnect patterns 201. The interconnect patterns 203 may include at least one metal selected from Ti, Al, Ni, Au, Pd, Cu, Co, and Pt. The first source electrode 201sa, the first drain electrode 201da, the second source electrode 201sb, and the second drain electrode 201db may be spaced apart from each other in a first direction X1 and may each extend in a second direction X2 crossing the first direction X1.

A ferroelectric pattern 401p may be interposed between the first source electrode 201sa and the first drain electrode 201da. The ferroelectric pattern 401p may include HfO2 doped with silicon (Si), aluminum (Al) or zirconium (Zr). Also, the ferroelectric pattern 401p my include one selected from the group consisting of lead zirconate titanate (PZT), lanthanum-modified lead zirconate titanate (PLZT), bismuth lanthanum titanate (BLT), barium strontium titanate (BST), strontium bismuth tantalite (SBT) and a combination thereof. However, the embodiment of the inventive concept is not limited thereto. For example, the PZT is [Pb(ZrxTi1-x)O_3], where 0.2<x<0.8, the PLZT is [(Pb1-yLay)(ZrxTi1-x)O_3], where 0.2<x<0.8 and 0.01<y<0.2, the BLT is [Bi_4-xLaxTi_3O_{12}], where 0.1<x<2, the BST is [(BaxSr1-x)TiO_3], where 0.5<x<1, and the SBT is [SrxBiyTa_2O_9], where 0.5<x<1.5 and 1.5<y<3. However, the embodiment of the inventive concept is not limited thereto.

The ferroelectric pattern 401p may be provided in plurality on the semiconductor layer 103. Although three ferroelectric patterns 401p are exemplarily illustrated in FIG. 1, two ferroelectric patterns 401p or four or more ferroelectric patterns 401p may be provided. The ferroelectric patterns 401p may be arranged in one row in the second direction X2. A first insulation pattern 400p may be interposed between the ferroelectric pattern 401p and the barrier layer 104. A second insulation pattern 402p may be disposed on the ferroelectric pattern 401p. Each of the first insulation pattern 400p and the second insulation pattern 402p may have at least one single-layer or multi-layer structure selected from SiO2, SiN, SiON or oxide layers such as $Al_2O_3$, HfOx, LaOx, and ZrOx.

Referring to FIGS. 1 and 3, a recessed region RC1 may be defined in each of the barrier layer 104 and the semiconductor layer 103 between the ferroelectric patterns 401p. Sidewalls of the barrier layer 104, the first insulation pattern 400p, the ferroelectric pattern 401p, and the second insulation pattern 402p may be exposed in an inside wall of the recessed region RC1. The inside wall and bottom surface of the recessed region RC1 may be covered by a third insulation pattern 301. The third insulation pattern 301 may have at least one single-layer or multi-layer structure selected from $SiO_2$, SiN, SiON or oxide layers such as $Al_2O_3$, HfOx, LaOx, and ZrOx. The recessed region RC1 may extend in the first direction X1 in FIG. 1. A portion of the semiconductor layer 103 may have a fin structure by the recessed region RC1.

A first gate electrode 204a may be disposed on the second insulation pattern 402p. A second gate electrode 204b may be disposed on the barrier layer 104 between the second source electrode 201sb and the second drain electrode 201 db. Each of the first gate electrode 204a and the second gate electrode 204b may include at least one metal selected from Ti, Al, Ni, Au, Pd, Cu, Co, and Pt. The first gate electrode 204a may extend in the second direction X2 to cover top surfaces and side surfaces of the ferroelectric patterns 401p. The first gate electrode 204a may contact the third insulation pattern 301.

The second gate electrode 204b may extend in the second direction X2. The second gate electrode 204b may directly contact the barrier layer 104. The second gate electrode 204b may have schottky junction with the barrier layer 104. Thus, since there is a great energy band gap between the second gate electrode 204b and the barrier layer 104, a gate insulation layer is not necessary. Also, when the second gate electrode 204b directly contacts the barrier layer 104, there is an advantage in frequency characteristic.

The first gate electrode 204a may be disposed at a central point between the first source electrode 201sa and the first drain electrode 201da or disposed closer to the first source electrode 201sa than the first drain electrode 201da. The second gate electrode 204b may be disposed at a central point between the second source electrode 201sb and the second drain electrode 201db or disposed closer to the second source electrode 201sb than the second drain electrode 201db.

The first gate electrode 204a, the second gate electrode 204b, the interconnect patterns 203, and the barrier layer 104 may be covered by a protection layer 302. The protection layer 302 may include SiO2, SiN, SiON, oxide layers such as $Al_2O_3$, HfOx, LaOx, and ZrOx, or polyimide.

In the first region R1, the first gate electrode 204a, the first source electrode 201sa, and the first drain electrode 201da may constitute a first transistor TR1. In the second region R2, the second gate electrode 204b, the second source electrode 201sb, and the second drain electrode 201db may constitute a second transistor TR2. The first transistor TR1 may have a positive threshold voltage. The second transistor TR2 may have a negative threshold voltage. The semiconductor device 1000 including the first transistor TR1 and the second transistor TR2 may be a HEMT device.

Figure 4:
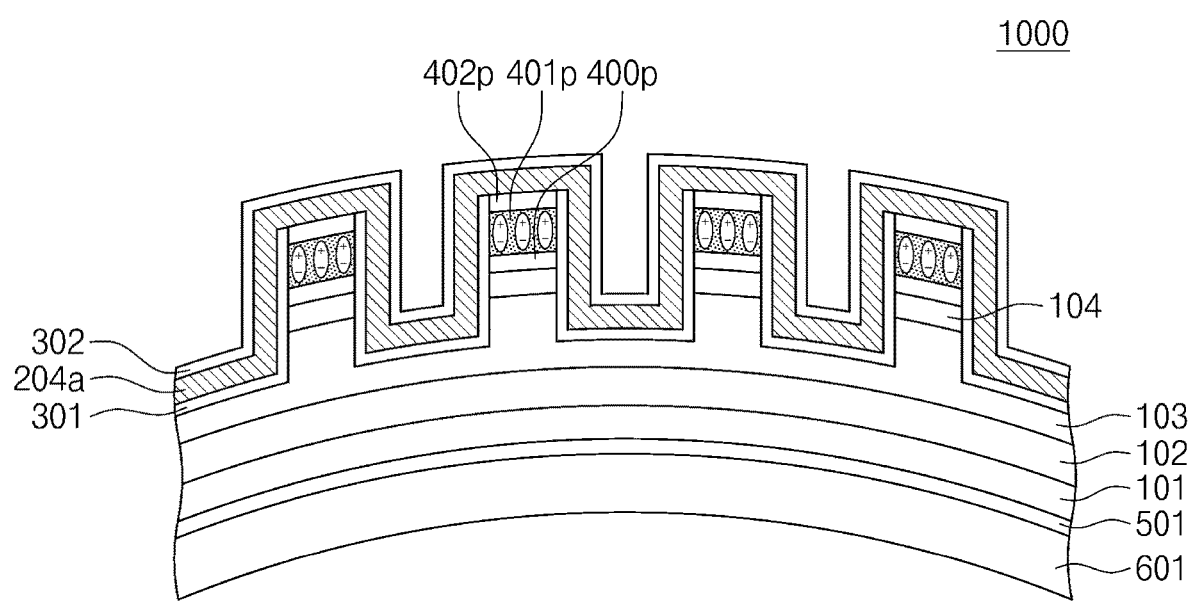
FIG. 4 is a view illustrating a polarization phenomenon of a ferroelectric pattern when a voltage is applied to the semiconductor device according to an embodiment of the inventive concept.

FIG. 4 is a view illustrating a polarization phenomenon of the ferroelectric pattern when a voltage is applied to the semiconductor device according to an embodiment of the inventive concept.

Referring to FIG. 4, the semiconductor device 1000 according to an embodiment may be bent by the flexible substrate 601. When a negative voltage (in the form of a pulse) is applied to the first gate electrode 204a, polarization is provided in the ferroelectric pattern 401p as in FIG. 4. Thus, an electron existing in the 2DEG layer may be pushed (or depleted) by a repulsive force, and resultantly, the first transistor TR1 may have a positive threshold voltage.

The semiconductor device having the negative (−) threshold voltage and the semiconductor device having the positive (+) threshold voltage may be simultaneously fabricated in one substrate in order to fabricate a flexible integrated circuit using the HEMT device. Also, after the integrated circuit is fabricated, the integrated circuit is required to be separated from the substrate and then bonded to the flexible substrate. However, the HEMT device generally has only the negative (−) threshold voltage due to the high concentration 2DEG. Although various efforts are made to obtain the HEMT device having the positive (+) threshold voltage, a process thereof is complicated, and a performance necessary for the high power-high frequency device is hardly obtained due to reduction of drain current. However, in an embodiment of the inventive concept, since the first transistor TR1 includes the ferroelectric pattern 401p and uses the fin gate structure, the first transistor TR1 may minimize a width of the fin and the reduction of drain current and have the positive threshold voltage. Thus, the HEMT device having the positive threshold voltage without deterioration in output and frequency characteristic may be realized.

FIGS. 5 to 10 and FIGS. 11A to 13A are cross-sectional views sequentially illustrating processes of fabricating the semiconductor device having the cross-section in FIG. 2 according to embodiments of the inventive concept. FIGS. 11B to 13B are cross-sectional views sequentially illustrating processes of fabricating the semiconductor device having the cross-section in FIG. 3 according to embodiments of the inventive concept.

Figure 5:
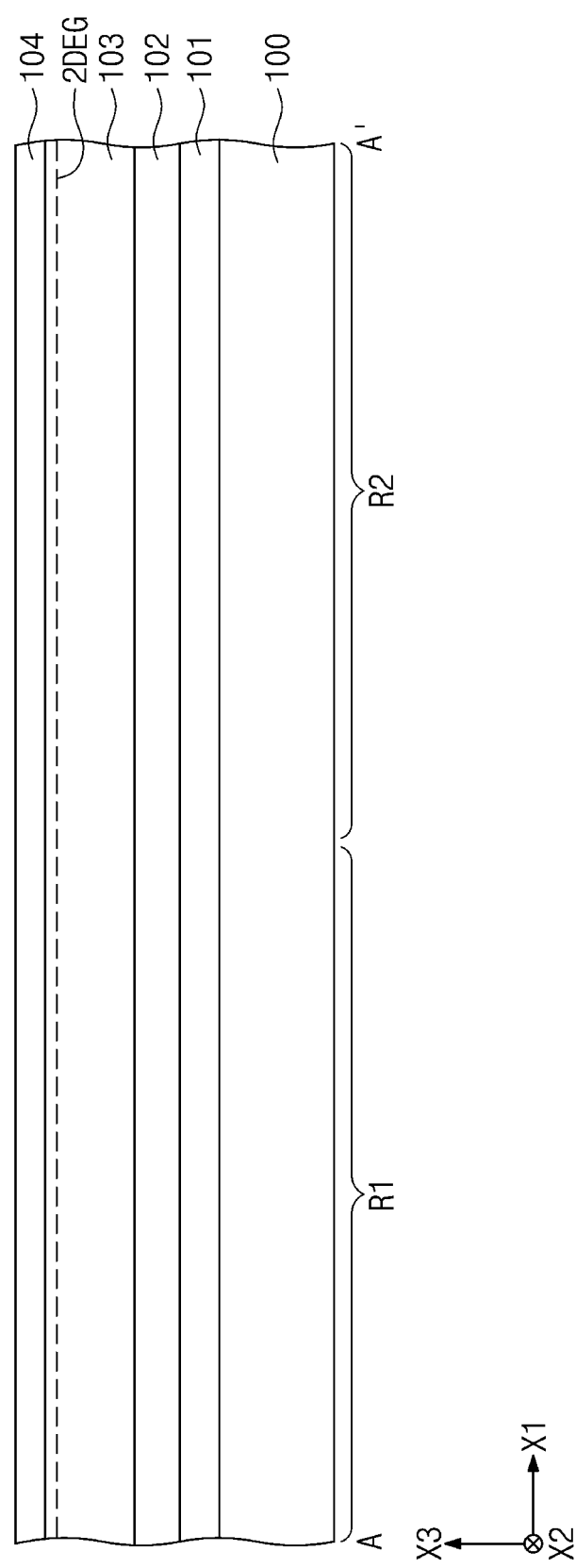

Referring to FIG. 5, a first sacrificial substrate 100 including a first region R1 and a second region R2 is provided. The first sacrificial substrate 100 may include, e.g., sapphire, silicon (Si), or silicon carbide (SiC). On the first sacrificial substrate 100, a separation layer 101, a buffer layer 102, a semiconductor layer 103, and a barrier layer 104 are sequentially laminated. The separation layer 101 may be a hexagonal boron nitride layer. The hexagonal boron nitride is a 2-dimensional material in which layers are bonded with a weak Van del Waals force. The separation layer 101 is formed on the first sacrificial substrate 100 in a contact manner. The separation layer 101 may be used to separate the first sacrificial substrate 100 in a following process. The buffer layer 102 may relieve a difference in thermal expansion coefficients and lattice constants between the first sacrificial substrate 100 and the semiconductor layer 103. Materials of the buffer layer 102, the semiconductor layer 103, and the barrier layer 104 may be the same as or similar to those described above. Each of the separation layer 101, the buffer layer 102, the semiconductor layer 103, and the barrier layer 104 may be formed through a deposition process such as chemical vapor deposition (CVD), atomic layer deposition (ALD), or selective epitaxial growth (SEG). When the separation layer 101 includes hexagonal boron nitride, and the buffer layer 102 includes gallium nitride, the gallium nitride is easily grown on the hexagonal boron nitride because the hexagonal boron nitride and the gallium nitride are the same nitride-based semiconductor material. Thus, the buffer layer 102 that is a high quality gallium nitride epitaxial layer 102 may be formed.

Figure 6:
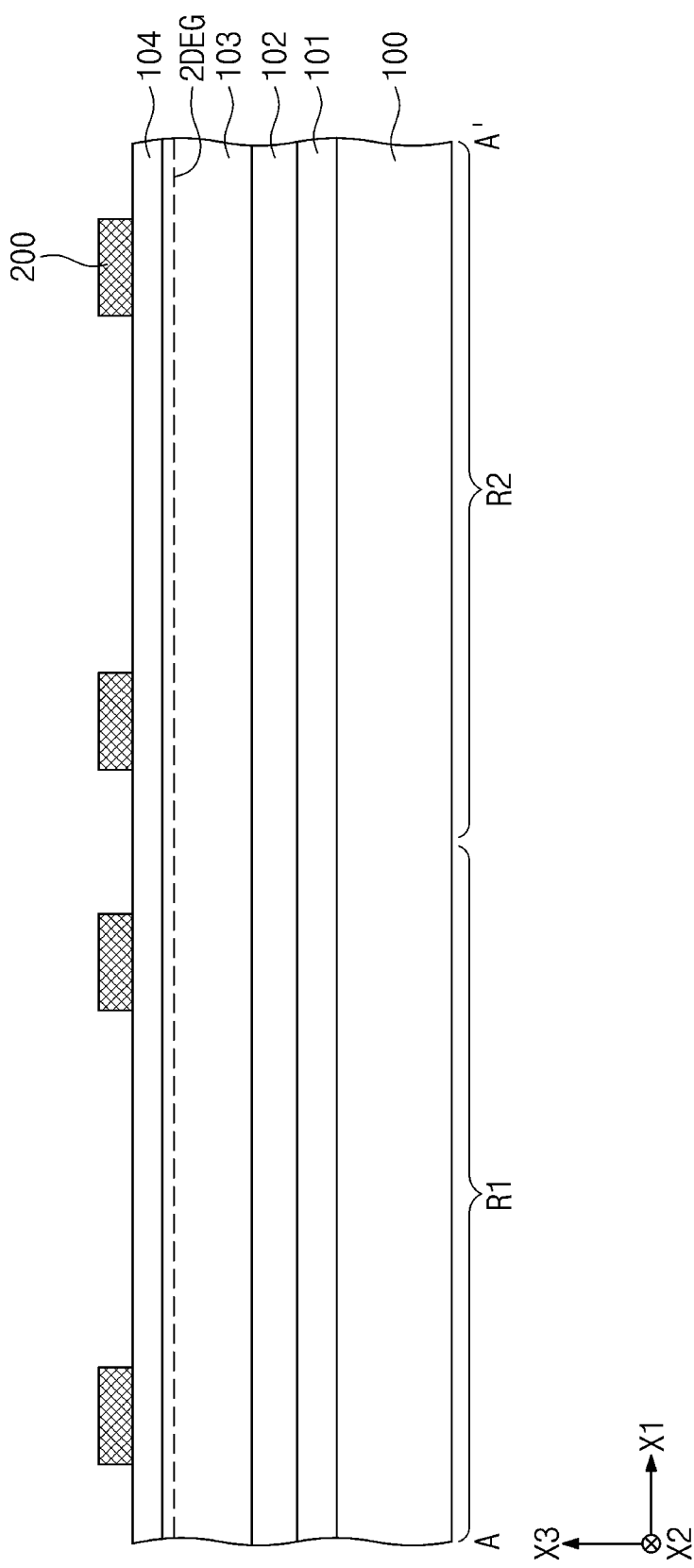

Referring to FIG. 6, metal patterns 200 may be formed on the barrier layer 104. The metal patterns 200 may include at least one selected from Ti, Al, Ni, Au, Pd, Cu, Co, and Pt. The metal patterns 200 may restrict positions of the first source electrode 201sa, the first drain electrode 201da, the second source electrode 201sb, and the second drain electrode 201, which are formed in the following process. The metal patterns 200 may be formed by a deposition process, a lift-off and/or an etching process. Each of the metal patterns 200 may have a thickness of several nanometers to several micrometers.

Figure 7:
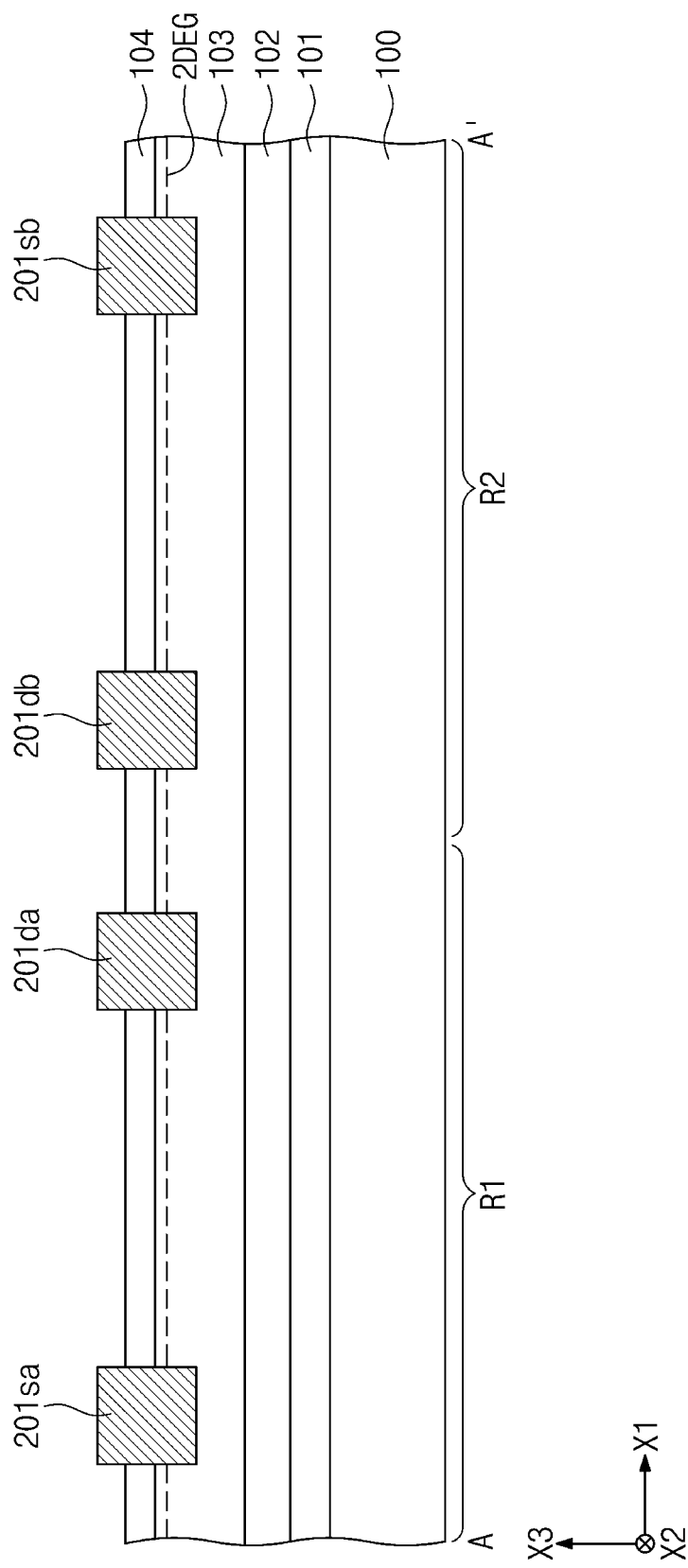

Referring to FIG. 7, the first source electrode 201sa, the first drain electrode 201da, the second source electrode 201sb, and the second drain electrode 201db are formed by performing a rapid thermal annealing (RTA) process to activate the metal patterns 200. Through the RTA process, the metals contained in the metal patterns 200 may be diffused into the barrier layer 104 and the semiconductor layer 103. Thus, the above-described metals are formed. That is, each of the first source electrode 201sa, the first drain electrode 201da, the second source electrode 201sb, and the second drain electrode 201db may be formed by forming an alloy with materials of the barrier layer 104 and the semiconductor layer 103. The RTA process may have a temperature of about 1000° C. or less.

Figure 8:
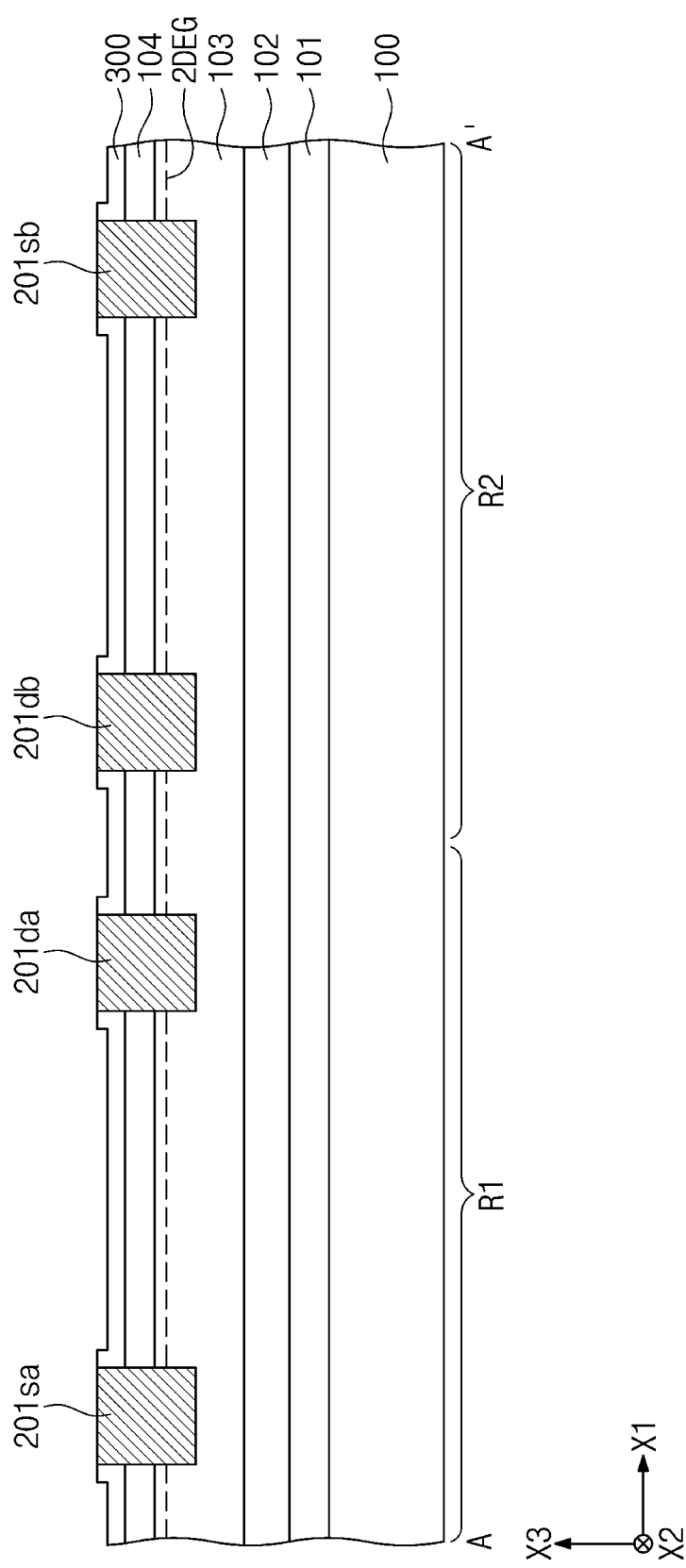

Referring to FIG. 8, a capping layer 300 is conformally formed on an entire surface of the barrier layer 104. The capping layer 300 may have at least one single-layer or multi-layer structure selected from SiO2, SiN, SiON or oxide layers such as $Al_2O_3$, HfOx, LaOx, and ZrOx. Top surfaces of the first source electrode 201sa, the first drain electrode 201da, the second source electrode 201sb, and the second drain electrode 201db may be exposed by removing a portion of the capping layer 300 through an etching process or a chemical mechanical polishing (CMP) process.

Figure 9:
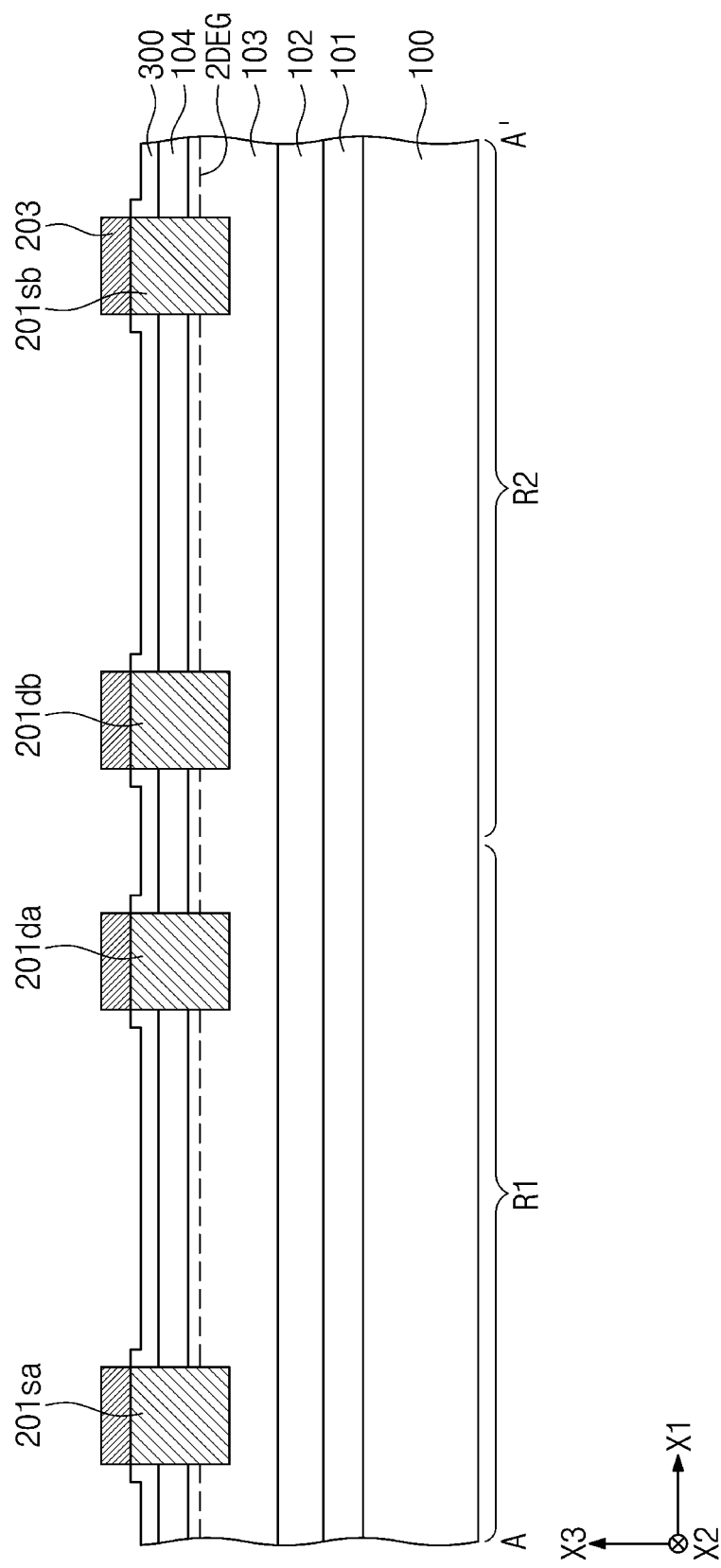

Referring to FIG. 9, interconnect patterns 203 may be formed on the top surfaces of the first source electrode 201sa, the first drain electrode 201da, the second source electrode 201sb, and the second drain electrode 201db. In order to form the interconnect patterns 203, a deposition process, a lift-off and/or an etching process may be performed. A portion of the interconnect patterns 203 may be formed even on the capping layer 300 to connect a portion of each of the first source electrode 201sa, the first drain electrode 201da, the second source electrode 201sb, and the second drain electrode 201 to each other.

Figure 10:
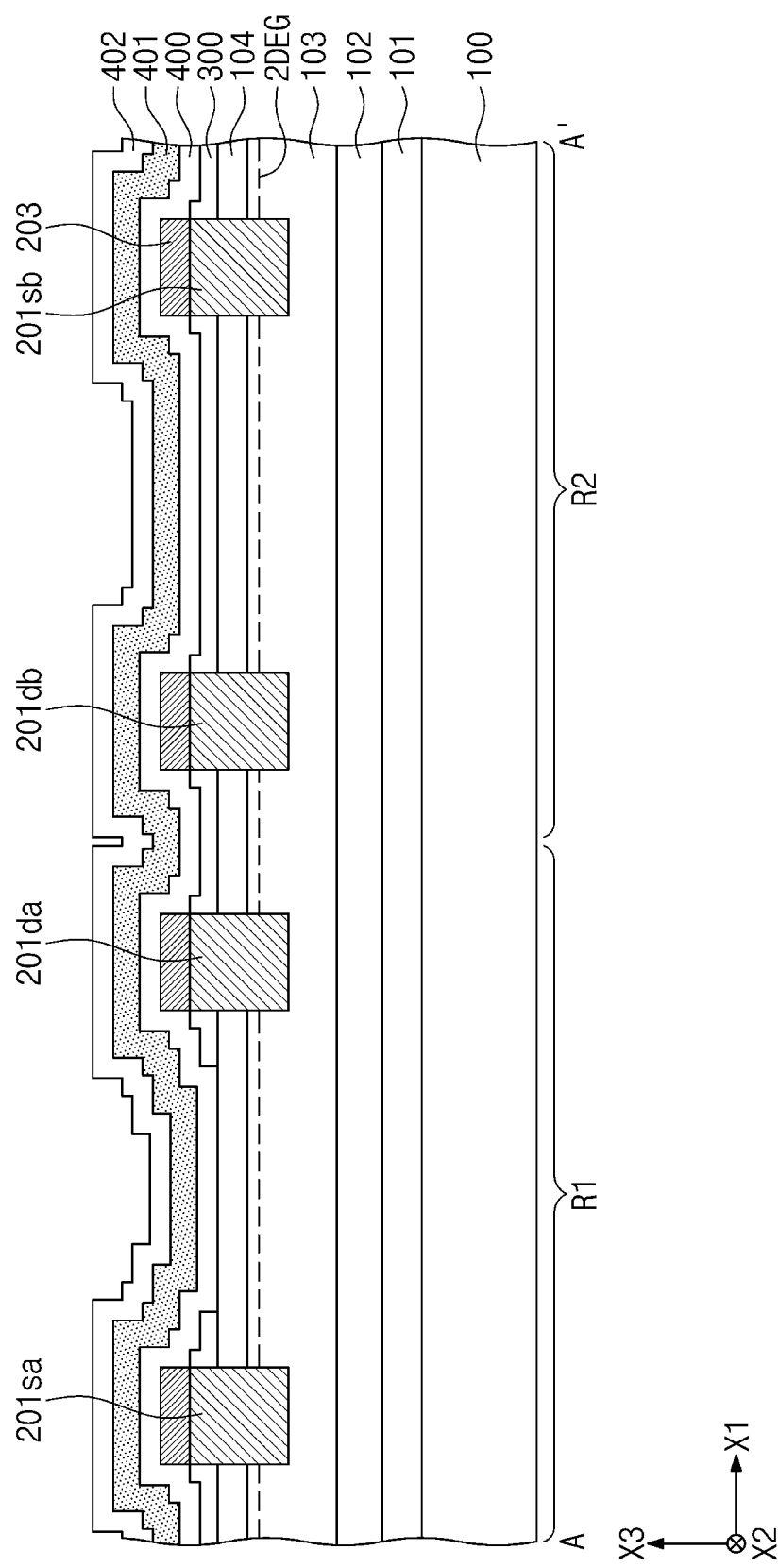

Referring to FIG. 10, the barrier layer 104 may be exposed by patterning the capping layer 300 between the first source electrode 201sa and the first drain electrode 201da. A first insulation layer 400, a ferroelectric layer 401, and a second insulation layer 402 may be conformally formed on the capping layer 300 in an order. Also, the RTA process may be performed to improve the polarization characteristic of the ferroelectric layer 401. Here, the RTA process may have a temperature of about several hundreds ° C.

Figure 11A:
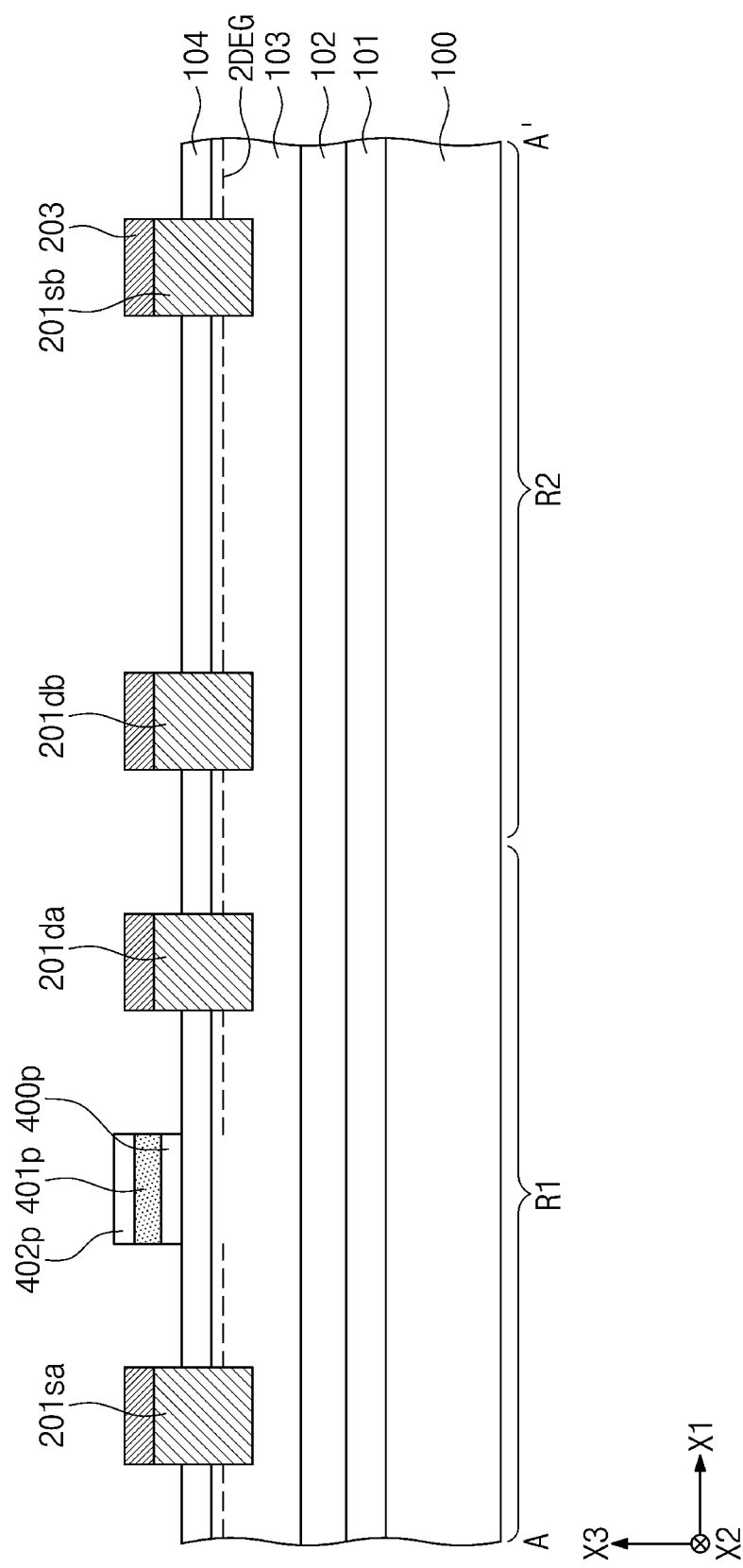
Figure 11B:
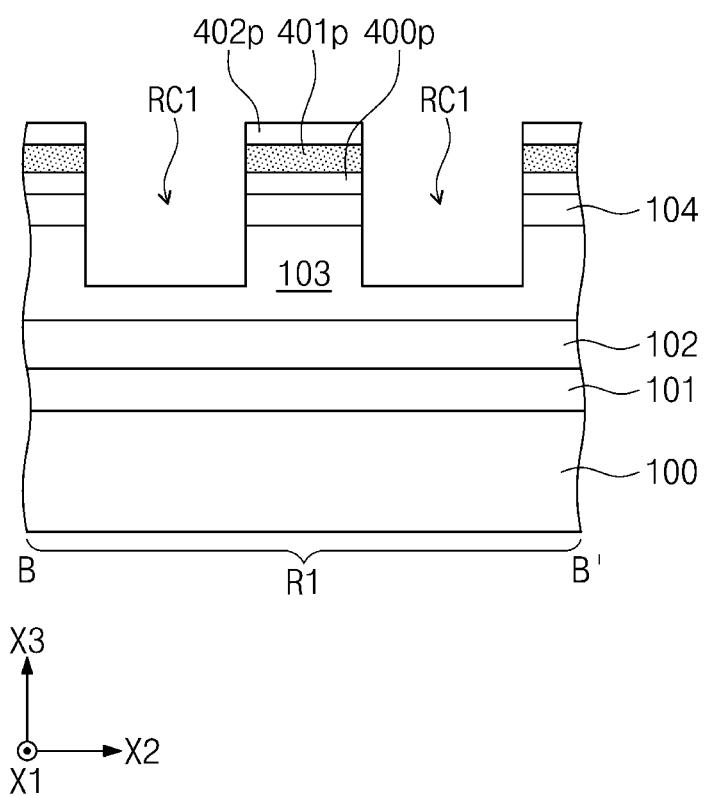

Referring to FIGS. 11A and 11B, the second insulation layer 402, the ferroelectric layer 401, and the first insulation layer 400 are sequentially etched to form second insulation patterns 402p, ferroelectric patterns 401p, and first insulation patterns 400p. The capping layer 300 below the first insulation layer 400 is removed. Then, recessed regions R1 may be formed by etching a portion of each of the barrier layer 104 and the semiconductor layer 103.

Figure 12A:
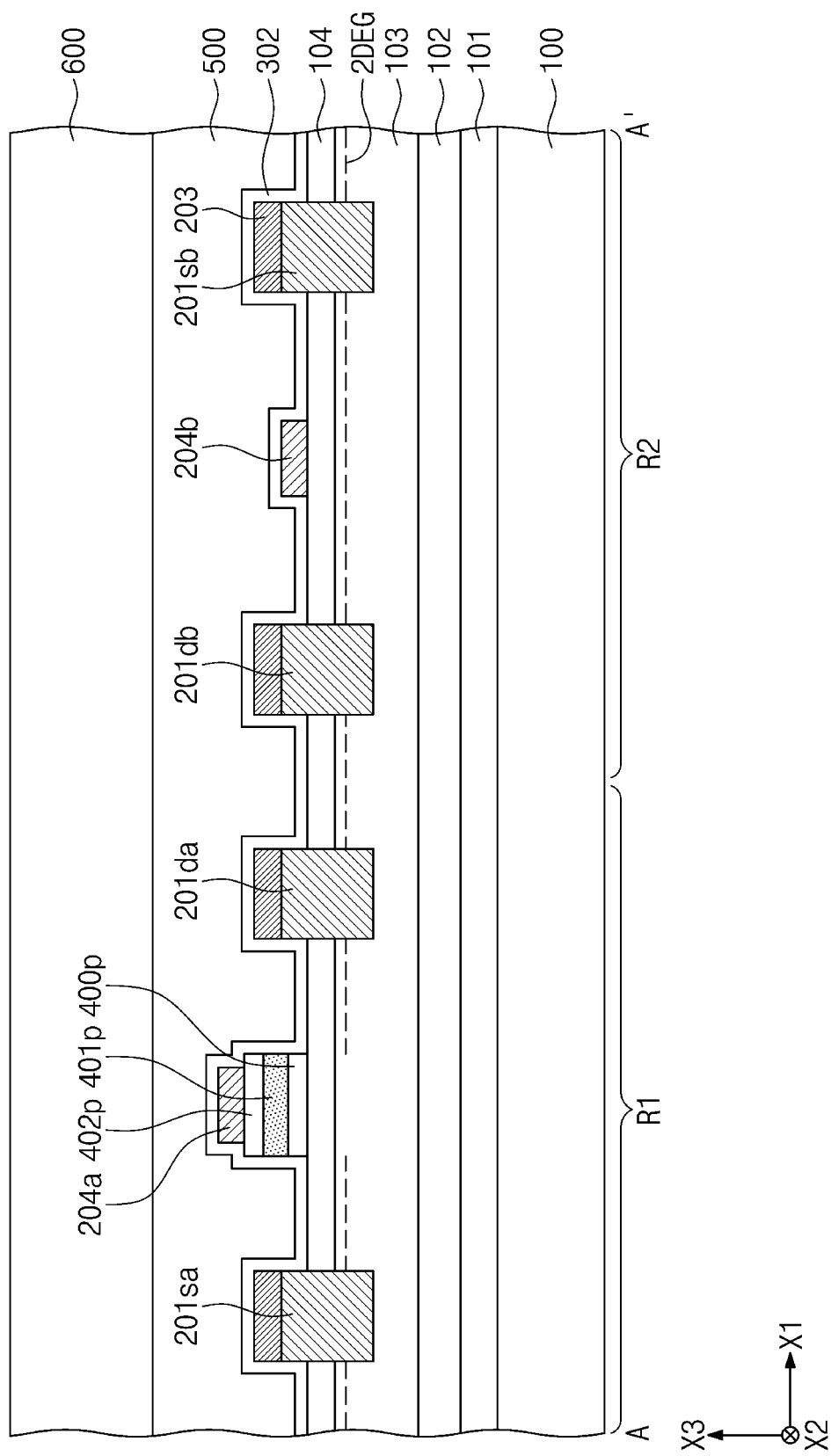
Figure 12B:
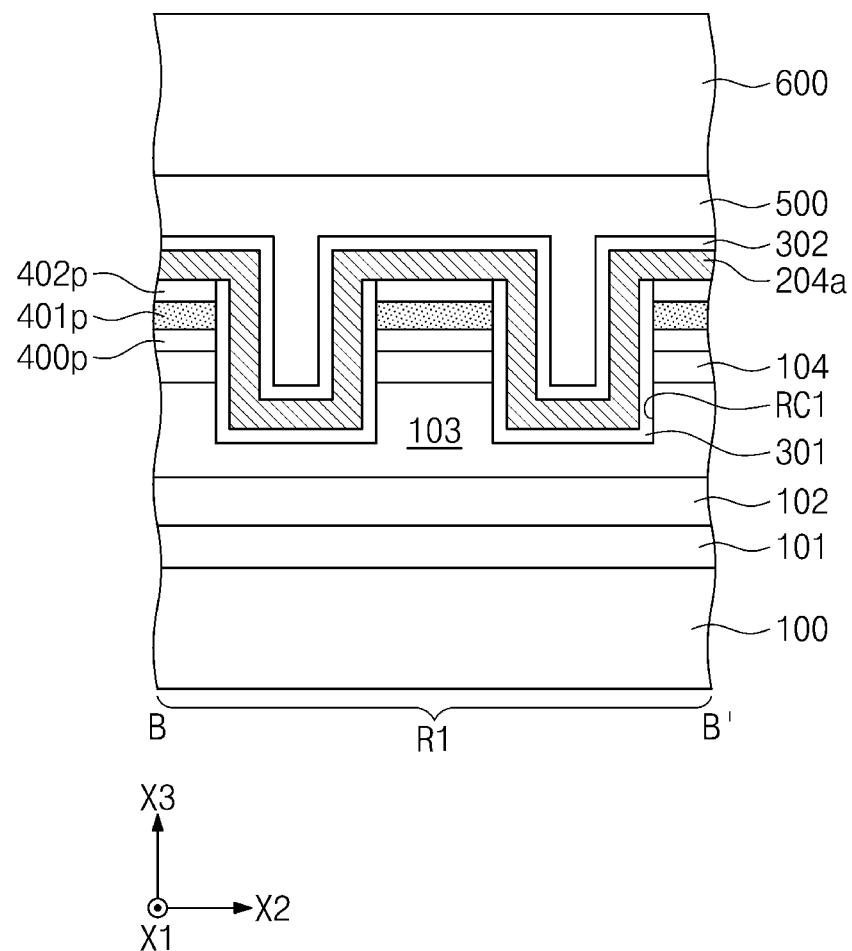
Figure 13A:
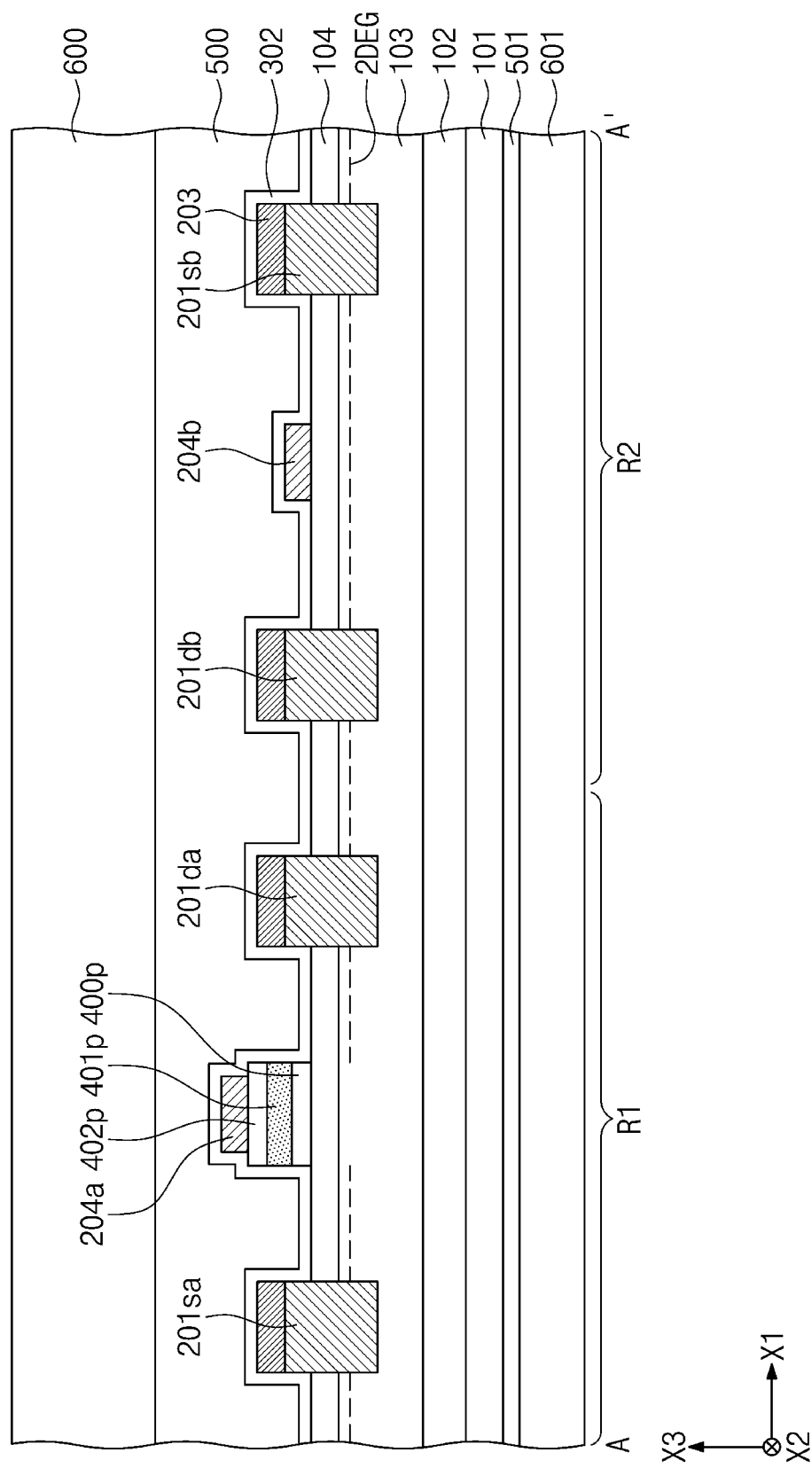
Figure 13B:
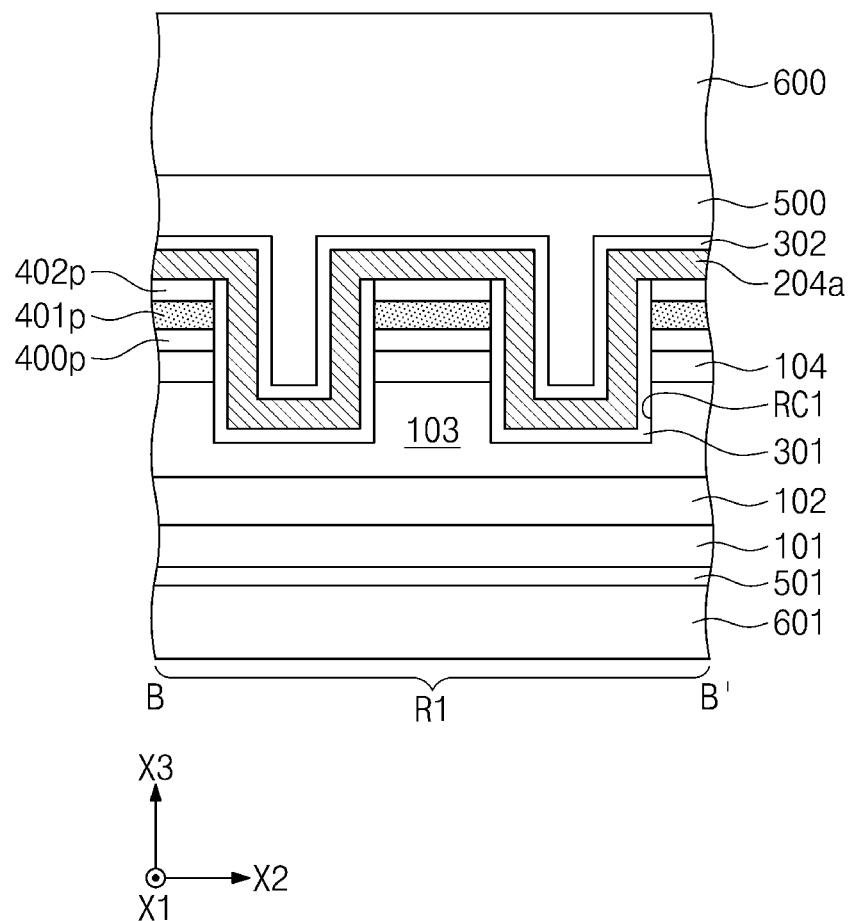

Referring to FIGS. 12A and 12B, a third insulation pattern 301 covering an inside wall and a bottom surface of the recessed region RC1 is formed by conformally stacking a third insulation layer (not shown) on an entire surface of the first sacrificial substrate 100 and then etching the third insulation layer. A first gate electrode 204a is formed on the second insulation pattern 402p and the third insulation pattern 301, and a second gate electrode 204b is formed on the barrier layer 104 in the second region R2 by conformally stacking a gate layer (not shown) on the entire surface of the first sacrificial substrate 100 and patterning the gate layer. A protection layer 302 is conformally stacked on the entire surface of the first sacrificial substrate 100. The protection layer 302 may protect a surface of the device and simultaneously reduce dangling bond existing on a surface of the barrier layer 104 to increase a concentration of a 2DEG and improve a current collapse phenomenon caused by drain voltage, thereby increasing a high frequency characteristic. Also, the protection layer 302 serves to weaken an electric field caused by the drain voltage and increase a breakdown voltage.

Although not shown in the drawings, a rapid thermal annealing may be performed to improve an interface characteristic between the barrier layer 104 and the protection layer 302 after the protection layer 302 is formed. Here, the rapid thermal annealing is performed at a temperature at which the polarization characteristic of the ferroelectric pattern 401p is not affected. Also, although not shown in the drawings, a contact pad region that is a portion of the interconnect pattern 203 may be opened to apply external bias after the protection layer 302 is formed. The contact pad region may be opened by etching the protection layer 302 through wet etching, dry etching, or a combined method thereof.

A sacrificial adhesive layer 500 and a second sacrificial substrate 600 may be sequentially laminated on the protection layer 302. The sacrificial adhesive layer 500 may include benzocyclobutene (BCB) resin or wax. The second sacrificial substrate 600 may include sapphire, silicon (Si), or silicon carbide (SiC).

Referring to FIGS. 12A and 12B and FIGS. 13A and 13B, the first sacrificial substrate 100 is separated from the separation layer 101. In case of a structure in FIGS. 12A and 12B, for example, as an etchant permeates between the first sacrificial substrate 100 and the separation layer 101 that is the hexagonal boron nitride layer when dipped into the etchant (e.g., aluminum etchant or hydrofluoric acid), the first sacrificial substrate 100 may be separated from the separation layer 101. Here, since the hexagonal boron nitride is a 2-dimensional material in which layers are bonded with a weak Van del Waals force, the first sacrificial substrate 100 may be easily separated (although the first sacrificial substrate 100 has a large area). After the first sacrificial substrate 100 is separated, a substrate 601 may be bonded by providing a substrate adhesive layer 501 therebetween.

Referring to FIGS. 1 to 3 again, the second sacrificial substrate 600 may be separated, and the sacrificial adhesive layer 500 may be removed to expose the protection layer 302. Thus, the semiconductor device 100 in FIGS. 1 to 3 may be fabricated.

In the method of fabricating the semiconductor device according to the embodiments of the inventive concept, since the hexagonal boron nitride layer is used as the separation layer 101, the buffer layer 102 may be properly formed, and the first sacrificial substrate 100 may be easily separated. Thus, the semiconductor device that is flexible without defects and has improved reliability may be fabricated. In addition, the first sacrificial substrate 100 may be recycled to save fabrication costs.

In the semiconductor device according to the embodiments of the inventive concept, since the first transistor includes the ferroelectric pattern and uses the fin gate structure, the width of the fin and the reduction of the drain current may be minimized, and the semiconductor device may have the positive threshold voltage. Thus, the HEMT device having the positive threshold voltage without deterioration in output and frequency characteristic may be realized. Thus, the flexible semiconductor device that is usable in the high power-high frequency system may be provided.

Also, in the method of fabricating the semiconductor device according to the embodiments of the inventive concept, since the hexagonal boron nitride layer is used as the separation layer, the buffer layer may be properly formed, and the first sacrificial substrate may be easily separated. Thus, the semiconductor device that is flexible without defects and has improved reliability may be fabricated. In addition, the first sacrificial substrate may be recycled to reduce the fabrication costs.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Therefore, the embodiments described above include exemplary in all respects and not restrictive, but it should be understood.

What is claimed is:

1. A semiconductor device comprising:
a substrate having a first region and a second region;
a buffer layer disposed on the substrate;
a semiconductor layer disposed on the buffer layer;
a barrier layer disposed on the semiconductor layer;
a first source electrode, a first drain electrode, and a first gate electrode disposed therebetween, which are disposed on the barrier layer in the first region;
a second source electrode, a second drain electrode, and a second gate electrode disposed therebetween, which are disposed on the barrier layer in the second region; and
a ferroelectric pattern interposed between the first gate electrode and the barrier layer;
wherein each of the first source electrode, the first drain electrode, the second source electrode, and the second drain electrode penetrates the barrier layer and extends into the semiconductor layer.

2. The semiconductor device of claim 1, wherein the substrate is flexible.

3. The semiconductor device of claim 1, further comprising an adhesive layer interposed between the substrate and the buffer layer.

4. The semiconductor device of claim 1, further comprising a hexagonal boron nitride layer interposed between the substrate and the buffer layer.

5. The semiconductor device of claim 1, wherein the first gate electrode, the first source electrode, and the first drain electrode constitute a first transistor, and
the second gate electrode, the second source electrode, and the second drain electrode constitute a second transistor,
the first transistor has a positive threshold voltage, and the second transistor has a negative threshold voltage.

6. The semiconductor device of claim 1, further comprising a 2-dimensional electron gas (2DEG) layer disposed in the semiconductor layer.

7. The semiconductor device of claim 1, further comprising a recessed region defined in an upper portion of each of the semiconductor layer and the barrier layer at one side of the first gate electrode, wherein a sidewall of the ferroelectric pattern is exposed from an inside wall of the recessed region, and the first gate electrode covers the inside wall and a bottom surface of the recessed region.

8. The semiconductor device of claim 7, further comprising a third insulation pattern interposed between the first gate electrode and the semiconductor layer, between the first gate electrode and a sidewall of the barrier layer, and between the first gate electrode and the sidewall of the ferroelectric pattern.

9. The semiconductor device of claim 1, further comprising:

a first insulation pattern interposed between the barrier layer and the ferroelectric pattern;

a second insulation pattern interposed between the ferroelectric pattern and the first gate electrode; and a protection layer configured to contact a side surface and a top surface of the first gate electrode, a side surface of the first insulation pattern, a side surface of the ferroelectric pattern, and a side surface of the second insulation pattern.

10. The semiconductor device of claim 1, wherein the second gate electrode contacts the barrier layer.

11. A semiconductor device comprising:

a substrate having a first region and a second region;

a buffer layer disposed on the substrate;

a semiconductor layer disposed on the buffer layer;

a barrier layer disposed on the semiconductor layer;

a first source electrode, a first drain electrode, and a first gate electrode disposed therebetween, which are disposed on the barrier layer in the first region;

a second source electrode, a second drain electrode, and a second gate electrode disposed therebetween, which are disposed on the barrier layer in the second region; and a ferroelectric pattern interposed between the first gate electrode and the barrier layer;

wherein the ferroelectric pattern is provided in plurality, a plurality of the ferroelectric patterns are arranged in one row in a first direction, and the first gate electrode extends in the first direction to cover side surfaces and top surfaces of the ferroelectric patterns.

12. A method of fabricating a semiconductor device, the method comprising:

sequentially stacking a separation layer, a buffer layer, a semiconductor layer, and a barrier layer on a first sacrificial substrate having a first region and a second region;

forming a first source electrode and a first drain electrode on the barrier layer in the first region and forming a second source electrode and a second drain electrode on the barrier layer in the second region;

forming a ferroelectric pattern on the barrier layer between the first source electrode and the first drain electrode;

forming a first gate electrode on the ferroelectric pattern and forming a second gate electrode on the barrier layer between the second source electrode and the second drain electrode; and removing the first sacrificial substrate;

wherein the forming of the first source electrode, the first drain electrode, the second source electrode, and the second drain electrode comprises:

forming metal patterns, which are spaced apart from each other, on the barrier layer; and diffusing metal in the metal patterns into a portion of each of the barrier layer and the semiconductor layer by performing a heat treatment process.

13. The method of claim 12, wherein the separation layer comprises a hexagonal boron nitride layer.

14. The method of claim 12, before the removing of the first sacrificial substrate, further comprising:

forming a first adhesive layer on the first gate electrode and the second gate electrode; and forming a second sacrificial substrate on the first adhesive layer.

15. The method of claim 14, before the forming of the first adhesive layer, further comprising:

forming a protection layer configured to cover an entire surface of the first sacrificial substrate on which the first gate electrode and the second gate electrode are formed.

16. The method of claim 12, after the removing of the first sacrificial substrate, further comprising:

forming a flexible substrate below the separation layer.

17. The method of claim 12, after the removing of the first sacrificial substrate, further comprising:

forming a second adhesive layer below the separation layer; and bonding a flexible substrate to the second adhesive layer.

18. The method of claim 12, before the forming of the first gate electrode and the second gate electrode, further comprising:

forming a recessed region by etching a portion of each of the semiconductor layer and the barrier layer, which is at a side of the ferroelectric pattern; and forming a third insulation pattern configured to cover an inside wall and a bottom surface of the recessed region.

* * * * *